United States Patent
Hsu et al.

(10) Patent No.: US 8,519,428 B2
(45) Date of Patent: Aug. 27, 2013

(54) VERTICAL STACKED LIGHT EMITTING STRUCTURE

(75) Inventors: Chi-Hsing Hsu, New Taipei (TW); Chun-Yu Lu, New Taipei (TW); Ming-Che Kuo, New Taipei (TW)

(73) Assignee: Azurewave Technologies, Inc., New Taipei (TW)

( * ) Notice: Subject to any disclaimer, the term of this patent is extended or adjusted under 35 U.S.C. 154(b) by 0 days.

(21) Appl. No.: 13/225,361

(22) Filed: Sep. 2, 2011

(65) Prior Publication Data
US 2013/0009175 A1    Jan. 10, 2013

(30) Foreign Application Priority Data
Jul. 4, 2011 (TW) ............................ 100212234 U

(51) Int. Cl.
*H01L 33/00* (2010.01)
(52) U.S. Cl.
USPC ................... 257/99; 257/84; 257/88; 257/98; 257/E21.592; 313/112; 313/501; 313/503

(58) Field of Classification Search
USPC .................. 257/80, 81, 12–13, 57, 66, 69, 72, 257/84, 88–89, 98–100, 103, 431–433, 347, 257/344, 705, 707; 313/112, 501, 503, 506
See application file for complete search history.

(56) References Cited

U.S. PATENT DOCUMENTS

| | | | |
|---|---|---|---|
| 7,283,313 B2 * | 10/2007 | Tamaoki et al. | 359/726 |
| 2002/0167015 A1 * | 11/2002 | Okazaki | 257/79 |
| 2005/0146270 A1 * | 7/2005 | Ho | 313/512 |
| 2007/0018189 A1 * | 1/2007 | Chin et al. | 257/99 |

* cited by examiner

*Primary Examiner* — Dung A. Le
(74) *Attorney, Agent, or Firm* — Li & Cai Intellectual Property (USA) Office

(57) ABSTRACT

A vertical stacked light emitting structure includes a substrate unit, a stacked type light emitting module, and a flip-chip type light emitting module. The substrate unit includes a substrate body. The stacked type light emitting module includes a first light emitting unit and a light guiding unit. The first light emitting unit includes at least one first LED bare chip disposed on and electrically connected to the substrate body, and the light guiding unit includes at least one light guiding body disposed on the first LED bare chip. The flip-chip type light emitting module includes a second light emitting unit. The second light emitting unit includes at least one second LED bare chip disposed on the light guiding body and electrically connected to the substrate body. Hence, the first LED bare chip, the light guiding body, and the second LED bare chip are stacked on top of one another sequentially.

11 Claims, 8 Drawing Sheets

VERTICAL STACKED LIGHT EMITTING STRUCTURE

BACKGROUND OF THE INVENTION

1. Field of the Invention

The instant disclosure relates to a light emitting structure, and more particularly, to a vertical stacked light emitting structure.

2. Description of Related Art

The invention of the lamp greatly changes the style of building construction and the lifestyle of human beings, allowing people to work during the night. Traditional lighting devices such as lamps that adopt incandescent bulbs, fluorescent bulbs, or power-saving bulbs have been generally well-developed and used intensively for indoor illumination.

Moreover, compared to the newly developed light-emitting-diode (LED) lamps, these traditional lamps have the disadvantages of quick attenuation, high power consumption, high heat generation, short service life, high fragility, and being not recyclable. Thus, various high-powered LED structures are created to replace the traditional light sources. However, the LEDs only can be arranged along a horizontal direction, thus the usage number of the LEDs is limited in the limited horizontal space and the light emitting efficiency cannot be increased.

SUMMARY OF THE INVENTION

One aspect of the instant disclosure relates to a vertical stacked light emitting structure using a plurality of LED bare chips stacked upwardly.

One of the embodiments of the instant disclosure provides a vertical stacked light emitting structure, comprising: a substrate unit, a stacked type light emitting module, and a flip-chip type light emitting module. The substrate unit includes at least one substrate body. The stacked type light emitting module includes a first light emitting unit and a light guiding unit, wherein the first light emitting unit includes at least one first LED bare chip disposed on the substrate body and electrically connected to the substrate body, the first LED bare chip has at least one first positive pad and at least one first negative pad, and the light guiding unit includes at least one light guiding body disposed on the first LED bare chip. The flip-chip type light emitting module includes a second light emitting unit, wherein the second light emitting unit includes at least one second LED bare chip disposed on the light guiding body and electrically connected to the substrate body, and the second LED bare chip has at least one second positive pad and at least one second negative pad disposed on the bottom surface thereof. Hence, the first LED bare chip, the light guiding body, and the second LED bare chip are stacked on top of one another sequentially.

Another one of the embodiments of the instant disclosure provides a vertical stacked light emitting structure, comprising: a substrate unit, a stacked type light emitting module, and a flip-chip type light emitting module. The substrate unit includes at least one substrate body. The stacked type light emitting module includes a light guiding unit and a first light emitting unit, wherein the light guiding unit includes at least one light guiding body disposed on the substrate body, at least two conductive traces disposed on the light guiding body, and at least two conductive support members disposed between the substrate body and the light guiding body, and each of the conductive traces is electrically connected to the substrate body through each corresponding conductive support member, wherein the first light emitting unit includes at least one first LED bare chip disposed on the bottom surface of the light guiding body and electrically connected to the at least two conductive traces, and the first LED bare chip has at least one first positive pad and at least one first negative pad. The flip-chip type light emitting module includes a second light emitting unit, wherein the second light emitting unit includes at least one second LED bare chip disposed on the top surface of the light guiding body and electrically connected to the at least two conductive traces, and the second LED bare chip has at least one second positive pad and at least one second negative pad disposed on the bottom surface thereof. Hence, the first LED bare chip, the light guiding body, and the second LED bare chip are stacked on top of one another sequentially.

Another one of the embodiments of the instant disclosure provides a vertical stacked light emitting structure, comprising: a substrate unit, a stacked type light emitting module, and a flip-chip type light emitting module. The substrate unit includes at least one substrate body. The stacked type light emitting module includes a first light emitting unit, wherein the first light emitting unit includes at least one first LED bare chip disposed on the substrate body and electrically connected to the substrate body, and the first LED bare chip has at least one first positive pad and at least one first negative pad. The flip-chip type light emitting module includes a second light emitting unit, wherein the second light emitting unit includes at least one second LED bare chip disposed on the first LED bare chip and electrically connected to the substrate body, and the second LED bare chip has at least one second positive pad and at least one second negative pad disposed on the bottom surface thereof. Hence, the first LED bare chip and the second LED bare chip are stacked on top of one another sequentially.

Therefore, because the at least one first LED bare chip, the at least one light guiding body, and the at least one second LED bare chip are stacked on top of one another sequentially, or the at least one first LED bare chip and the at least one second LED bare chip are stacked on top of one another sequentially, the light-emitting efficiency of the instant disclosure can be increased.

To further understand the techniques, means and effects of the instant disclosure applied for achieving the prescribed objectives, the following detailed descriptions and appended drawings are hereby referred, such that, through which, the purposes, features and aspects of the instant disclosure can be thoroughly and concretely appreciated. However, the appended drawings are provided solely for reference and illustration, without any intention to limit the instant disclosure.

DETAILED DESCRIPTION OF THE PREFERRED EMBODIMENTS

First Embodiment

Figure 1:
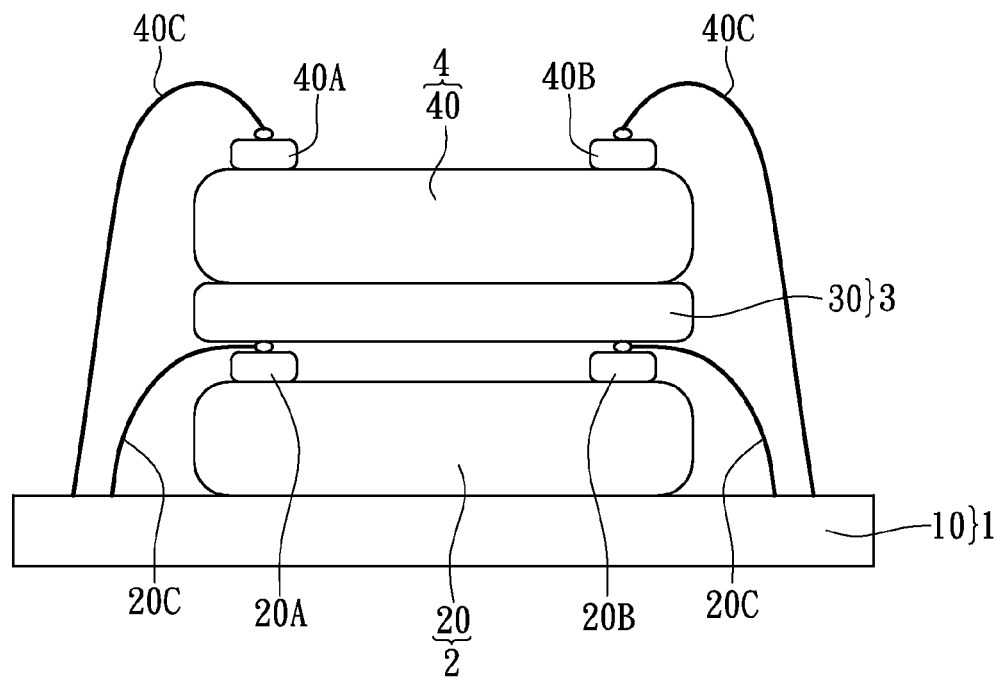
FIG. 1 shows a lateral, schematic view of the first embodiment of the instant disclosure.

Referring to FIG. 1, where the first embodiment provides a vertical stacked light emitting structure, comprising: a substrate unit 1, a first light emitting unit 2, a light guiding unit 3, and a second light emitting unit 4. The first light emitting unit 2, the light guiding unit 3, and the second light emitting unit 4 are vertically and upwardly stacked on top of one another sequentially from the substrate unit 1.

The substrate unit 1 includes at least one substrate body 10. For example, the substrate body 10 may be a circuit substrate, and the circuit substrate has a plurality of conductive traces (not shown) disposed thereon.

Furthermore, the first light emitting unit 2 includes at least one first LED bare chip 20 disposed on the substrate body 10 and electrically connected to the substrate body 10. Of course, the instant disclosure can use a plurality of first LED bare chips 20 sequentially stacked on top of one another and electrically connected to the substrate body 10 according to different requirements. In addition, the bottom surface of the first LED bare chip 20 contacts the top surface of the substrate body 10. The first LED bare chip 20 has at least one first positive pad 20A and at least one first negative pad 20B disposed on the top surface thereof, and at least two first conductive elements 20C (such as metal conductive wires) are respectively electrically connected between the first positive pad 20A and the substrate body 10 and between the first negative pad 20B and the substrate body 10. For example, the first positive pad 20A and the first negative pad 20B of the first LED bare chip 20 can be electrically connected to the substrate body 10 by a wire bonding manner.

Moreover, the light guiding unit 3 includes at least one light guiding body 30 disposed on the first LED bare chip 20. The light guiding unit 3 is disposed between the first light emitting unit 2 and the second light emitting unit 4, and the first positive pad 20A and the first negative pad 20B of the first LED bare chip 20 are simultaneously contact the bottom surface of the least one light guiding body 30. For example, the least one light guiding body 30 may be a plastic light-guiding body made of plastic material, a glass light-guiding body made of glass material, etc. However, the least one light guiding body 30 used in the instant disclosure is merely an example and is not meant to limit the instant disclosure.

Besides, the second light emitting unit 4 includes at least one second LED bare chip 40 disposed on the light guiding body 30 and electrically connected to the substrate body 10, thus the first LED bare chip 20, the light guiding body 30, and the second LED bare chip 40 can be vertically and upwardly stacked on top of one another sequentially. Of course, the instant disclosure can use a plurality of second LED bare chips 40 sequentially stacked on top of one another and electrically connected to the substrate body 10 according to different requirements. In addition, the bottom surface of the second LED bare chip 40 contacts the top surface of the light guiding body 30. The second LED bare chip 40 has at least one second positive pad 40A and at least one second negative pad 40B disposed on the top surface thereof, and at least two second conductive elements 40C (such as metal conductive wires) are respectively electrically connected between the second positive pad 40A and the substrate body 10 and between the second negative pad 40B and the substrate body 10. For example, the second positive pad 40A and the second negative pad 40B of the second LED bare chip 40 can be electrically connected to the substrate body 10 by a wire bonding manner.

Second Embodiment

Figure 2:
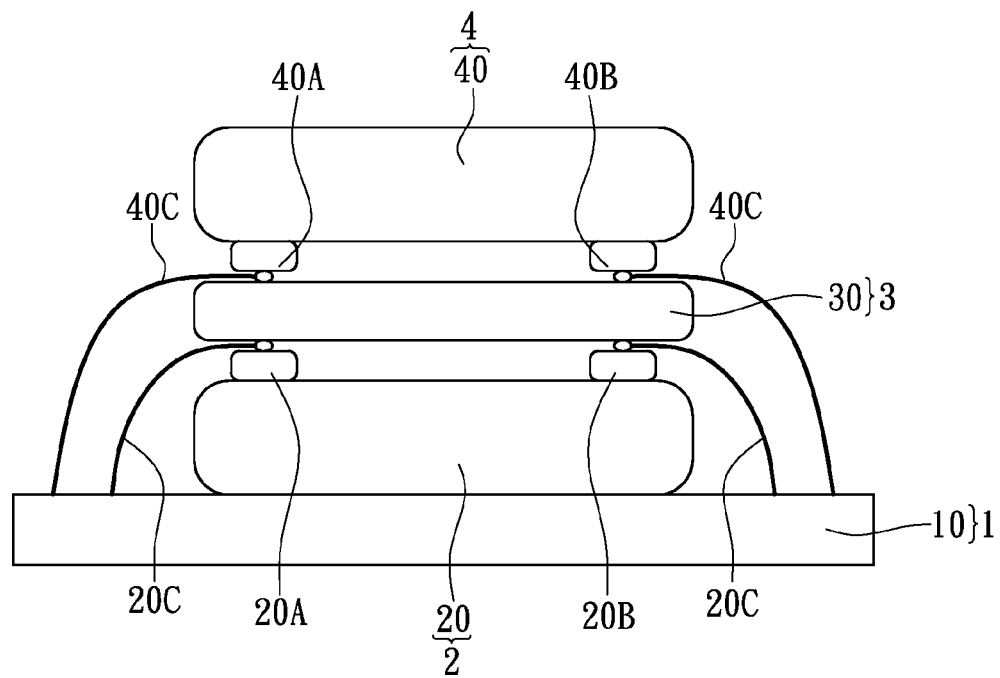
FIG. 2 shows a lateral, schematic view of the second embodiment of the instant disclosure.

Referring to FIG. 2, where the second embodiment provides a vertical stacked light emitting structure, comprising: a substrate unit 1, a first light emitting unit 2, a light guiding unit 3, and a second light emitting unit 4. In addition, the first light emitting unit 2 and the light guiding unit 3 are combined to form a stacked type light emitting module, and the second light emitting unit 4 is a flip-chip type light emitting module. Comparing FIG. 2 with FIG. 1, the difference between the second embodiment and the first embodiment is that: in the second embodiment, the second LED bare chip 40 has at least one second positive pad 40A and at least one second negative pad 40B disposed on the bottom surface thereof, the second positive pad 40A and the second negative pad 40B can simultaneously contact the top surface of the light guiding body 30, and at least two second conductive elements 40C (such as metal conductive wires) can be respectively electrically connected between the second positive pad 40A and the substrate body 10 and between the second negative pad 40B and the substrate body 10. For example, the second positive pad 40A and the second negative pad 40B of the second LED bare chip 40 can be electrically connected to the substrate body 10 by a wire bonding manner.

Third Embodiment

Figure 3:
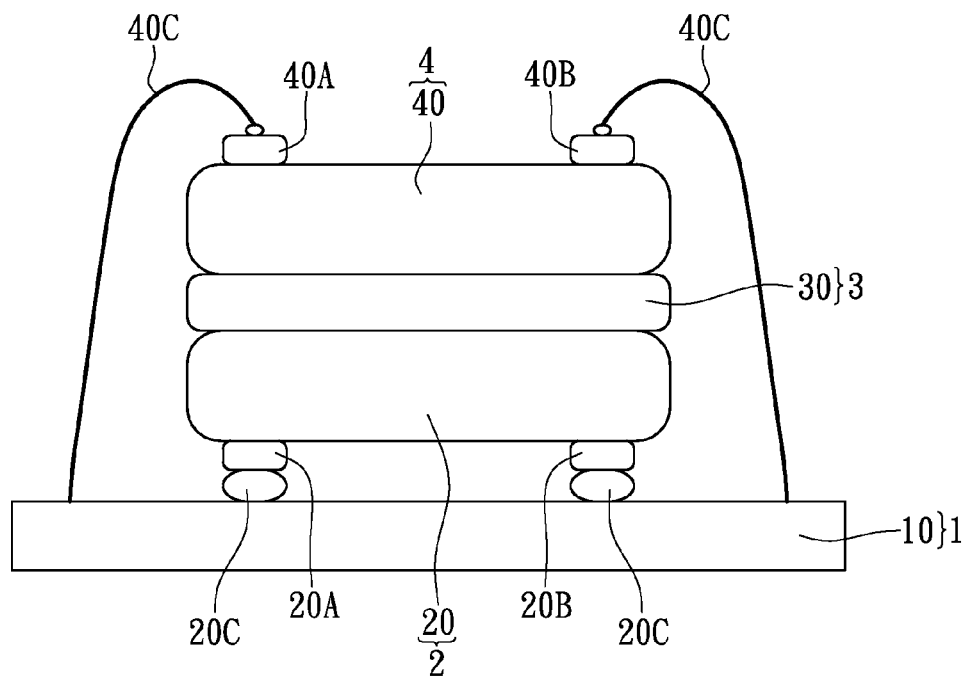
FIG. 3 shows a lateral, schematic view of the third embodiment of the instant disclosure.

Referring to FIG. 3, where the third embodiment provides a vertical stacked light emitting structure, comprising: a substrate unit 1, a first light emitting unit 2, a light guiding unit 3, and a second light emitting unit 4. Comparing FIG. 3 with FIG. 1, the difference between the third embodiment and the first embodiment is that: in the third embodiment, the top surface of the first LED bare chip 20 can contact the bottom surface of the light guiding body 30, the first LED bare chip 20 has at least one first positive pad 20A and at least one first negative pad 20B disposed on the bottom surface thereof, and at least two first conductive elements 20C (such as solder balls) are respectively electrically connected between the first positive pad 20A and the substrate body 10 and between the first negative pad 20B and the substrate body 10. For example, the first positive pad 20A and the first negative pad 20B of the first LED bare chip 20 can be electrically connected to the substrate body 10 by a flip chip manner.

Fourth Embodiment

Figure 4:
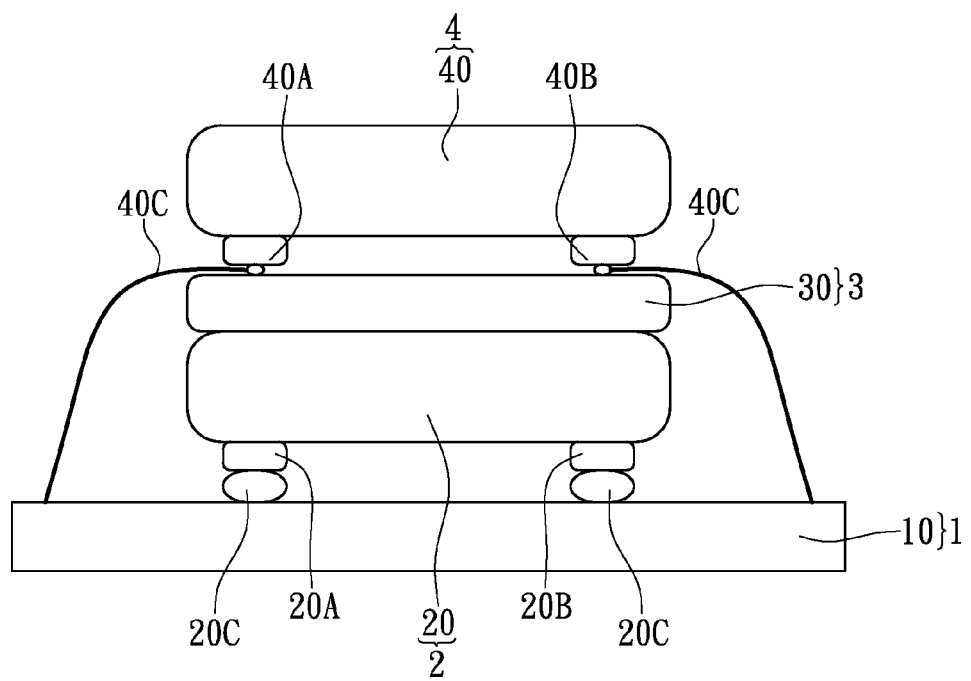
FIG. 4 shows a lateral, schematic view of the fourth embodiment of the instant disclosure.

Referring to FIG. 4, where the fourth embodiment provides a vertical stacked light emitting structure, comprising: a substrate unit 1, a first light emitting unit 2, a light guiding unit 3, and a second light emitting unit 4. In addition, the first light emitting unit 2 and the light guiding unit 3 are combined to form a stacked type light emitting module, and the second light emitting unit 4 is a flip-chip type light emitting module. Comparing FIG. 4 with FIG. 3, the difference between the fourth embodiment and the third embodiment is that: in the fourth embodiment, the second LED bare chip 40 has at least one second positive pad 40A and at least one second negative pad 40B disposed on the bottom surface thereof, the second positive pad 40A and the second negative pad 40B can simultaneously contact the top surface of the light guiding body 30, and at least two second conductive elements 40C (such as metal conductive wires) are respectively electrically connected between the second positive pad 40A and the substrate body 10 and between the second negative pad 40B and the substrate body 10. For example, the second positive pad 40A and the second negative pad 40B of the second LED bare chip 40 can be electrically connected to the substrate body 10 by a wire bonding manner.

Fifth Embodiment

Figure 5:
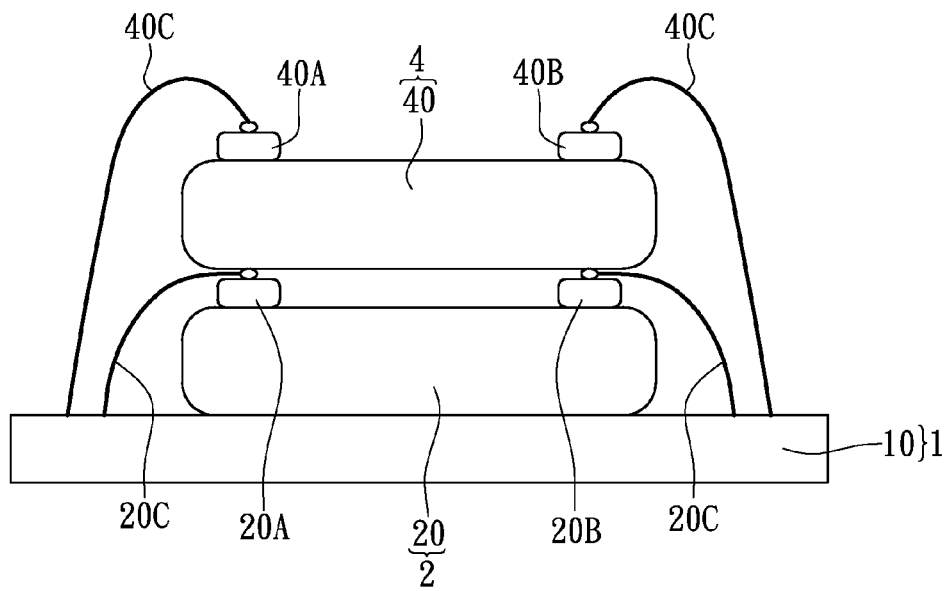
FIG. 5 shows a lateral, schematic view of the fifth embodiment of the instant disclosure.

Referring to FIG. 5, where the fifth embodiment provides a vertical stacked light emitting structure, comprising: a substrate unit 1, a first light emitting unit 2, and a second light emitting unit 4. The first light emitting unit 2 and the second light emitting unit 4 are vertically and upwardly stacked on top of one another sequentially from the substrate unit 1. Comparing FIG. 5 with FIG. 1, the difference between the fifth embodiment and the first embodiment is that: the fifth embodiment can omit the light guiding unit 3 used in the first embodiment, thus the second light emitting unit 4 includes at least one second LED bare chip 40 disposed on the first LED bare chip 20 and electrically connected to the substrate body 10, and the first LED bare chip 20 and the second LED bare chip 40 are vertically and upwardly stacked on top of one another sequentially.

Moreover, the bottom surface of the first LED bare chip 20 contacts the top surface of the substrate body 10. The first LED bare chip 20 has at least one first positive pad 20A and at least one first negative pad 20B disposed on the top surface thereof, and at least two first conductive elements 20C (such as metal conductive wires) are respectively electrically connected between the first positive pad 20A and the substrate body 10 and between the first negative pad 20B and the substrate body 10. In addition, the bottom surface of the second LED bare chip 40 can contact the first positive pad 20A and the first negative pad 20B of the first LED bare chip 20. The second LED bare chip 40 has at least one second positive pad 40A and at least one second negative pad 40B disposed on the top surface thereof, and at least two second conductive elements 40C (such as metal conductive wires) are respectively electrically connected between the second positive pad 40A and the substrate body 10 and between the second negative pad 40B and the substrate body 10. For example, the second positive pad 40A and the second negative pad 40B of the second LED bare chip 40 can be electrically connected to the substrate body 10 by a wire bonding manner.

Sixth Embodiment

Figure 6:
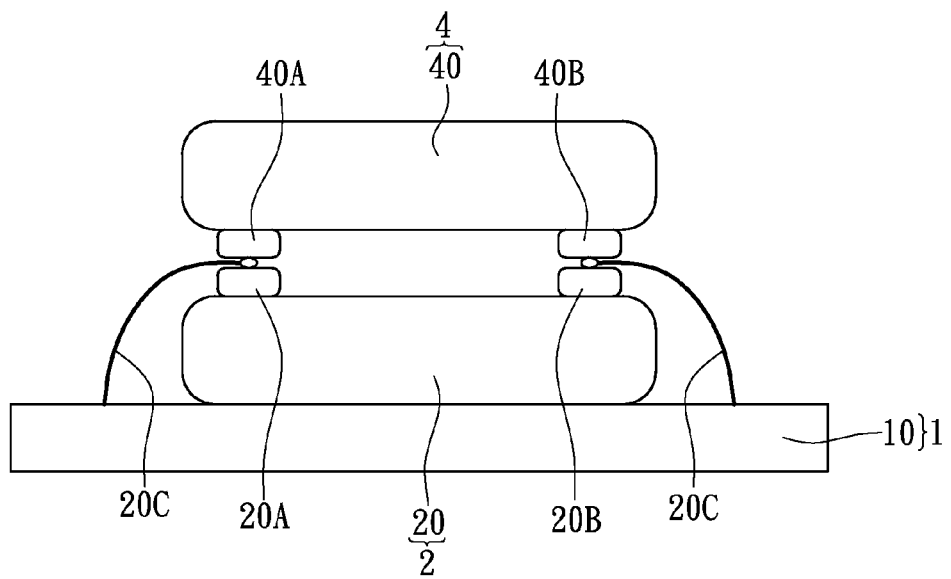
FIG. 6 shows a lateral, schematic view of the sixth embodiment of the instant disclosure.

Referring to FIG. 6, where the sixth embodiment provides a vertical stacked light emitting structure, comprising: a substrate unit 1, a first light emitting unit 2, and a second light emitting unit 4. In addition, the first light emitting unit 2 is a stacked type light emitting module, and the second light emitting unit 4 is a flip-chip type light emitting module. Comparing FIG. 6 with FIG. 5, the difference between the sixth embodiment and the fifth embodiment is that: in the sixth embodiment, the second LED bare chip 40 has at least one second positive pad 40A and at least one second negative pad 40B disposed on the bottom surface thereof, the second positive pad 40A and the second negative pad 40B of the second LED bare chip 40 respectively contact the first positive pad 20A and the first negative pad 20B of the first LED bare chip 20, and at least two first conductive elements 20C are respectively electrically connected between the second positive pad 40A and the substrate body 10 and between the second negative pad 40B and the substrate body 10.

Seventh Embodiment

Figure 7:
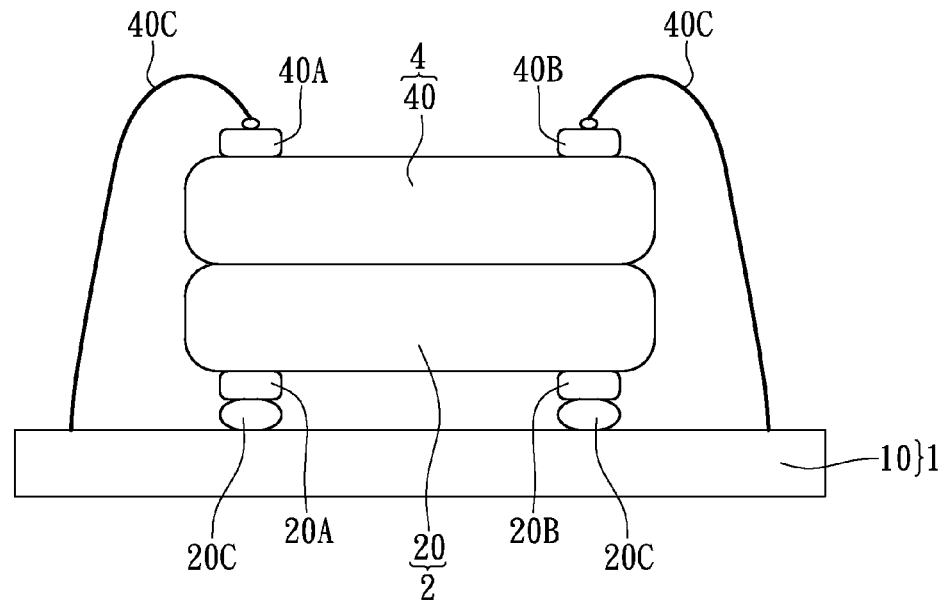
FIG. 7 shows a lateral, schematic view of the seventh embodiment of the instant disclosure.

Referring to FIG. 7, where the seventh embodiment provides a vertical stacked light emitting structure, comprising: a substrate unit 1, a first light emitting unit 2, and a second light emitting unit 4. Comparing FIG. 7 with FIG. 5, the difference between the seventh embodiment and the fifth embodiment is that: in the seventh embodiment, the first LED bare chip 20 has at least one first positive pad 20A and at least one first negative pad 20B disposed on the bottom surface thereof, and at least two first conductive elements 20C (such as solder balls) are respectively electrically connected between the first positive pad 20A and the substrate body 10 and between the first negative pad 20B and the substrate body 10. In addition, the bottom surface of the second LED bare chip 40 contacts the top surface of the first LED bare chip 20.

Eighth Embodiment

Figure 8:
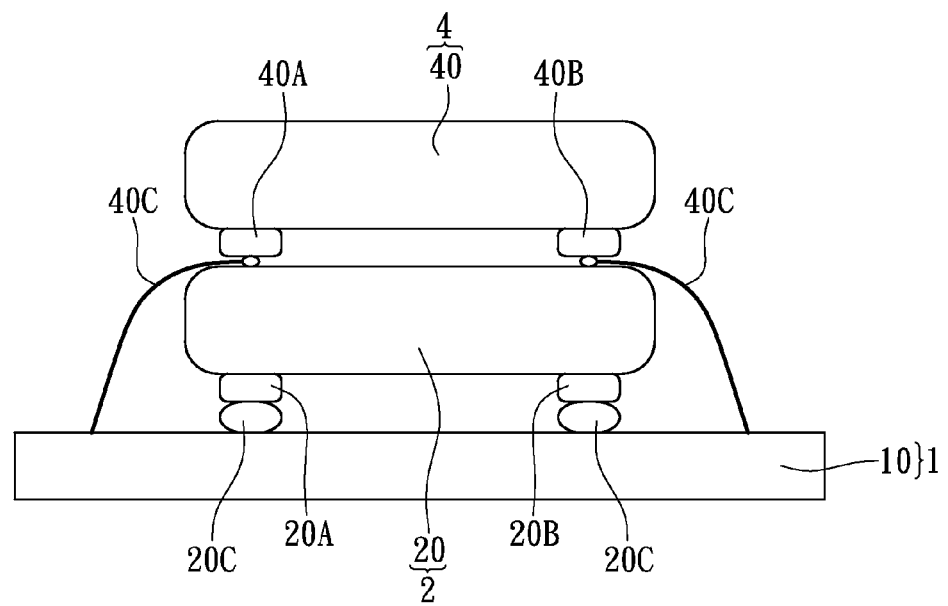
FIG. 8 shows a lateral, schematic view of the eighth embodiment of the instant disclosure.

Referring to FIG. 8, where the eighth embodiment provides a vertical stacked light emitting structure, comprising: a substrate unit 1, a first light emitting unit 2, and a second light emitting unit 4. In addition, the first light emitting unit 2 is a stacked type light emitting module, and the second light emitting unit 4 is a flip-chip type light emitting module. Comparing FIG. 8 with FIG. 7, the difference between the eighth embodiment and the seventh embodiment is that: in the eighth embodiment, the second LED bare chip 40 has at least one second positive pad 40A and at least one second negative pad 40B disposed on the top surface thereof, the second positive pad 40A and the second negative pad 40B can simultaneously contact the top surface of the first LED bare chip 20, and at least two first conductive elements 40C (such as metal conductive wires) are respectively electrically connected between the second positive pad 40A and the substrate body 10 and between the second negative pad 40B and the substrate body 10.

Ninth Embodiment

Figure 9:
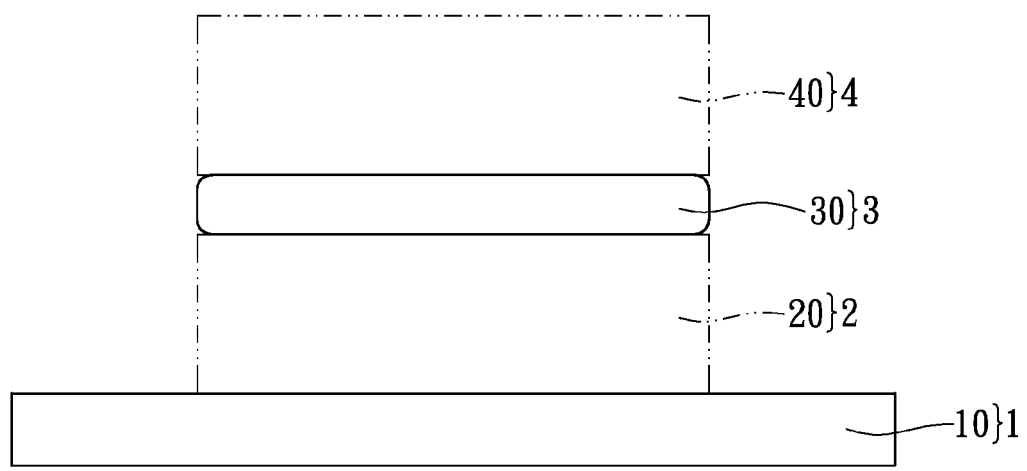
FIG. 9 shows a lateral, schematic view of the ninth embodiment of the instant disclosure.

Referring to FIG. 9, where the ninth embodiment provides a vertical stacked light emitting structure, comprising: a substrate unit 1, a first light emitting unit 2, a light guiding unit 3, and a second light emitting unit 4. The first light emitting unit 2, the light guiding unit 3, and the second light emitting unit 4 are vertically and upwardly stacked on top of one another sequentially from the substrate unit 1. Comparing FIG. 9 with FIG. 1, the difference between the ninth embodiment and the first embodiment is that: in the ninth embodiment, the first light emitting unit 2 includes a plurality first LED bare chips 20 disposed on the substrate body 10 and electrically connected to the substrate body 10, and the first LED bare chips 20 can be upwardly stacked on top of one another sequentially. The light guiding unit 3 includes at least one light guiding body 30 disposed on the first LED bare chip 20. The second light emitting unit 4 includes a plurality of second LED bare chips 40 disposed on the light guiding body 30 and electrically connected to the substrate body 10, and the second LED bare chips 40 can be upwardly stacked on top of one another sequentially. In other words, the instant disclosure can use one first LED bare chip 20 (as shown in the first embodiment) or more first LED bare chips 20 (as shown in the ninth embodiment) and the instant disclosure also can use one second LED bare chip 40 (as shown in the first embodiment) or more second LED bare chips 40 (as shown in the ninth embodiment), according to different requirements.

Tenth Embodiment

Figure 10:
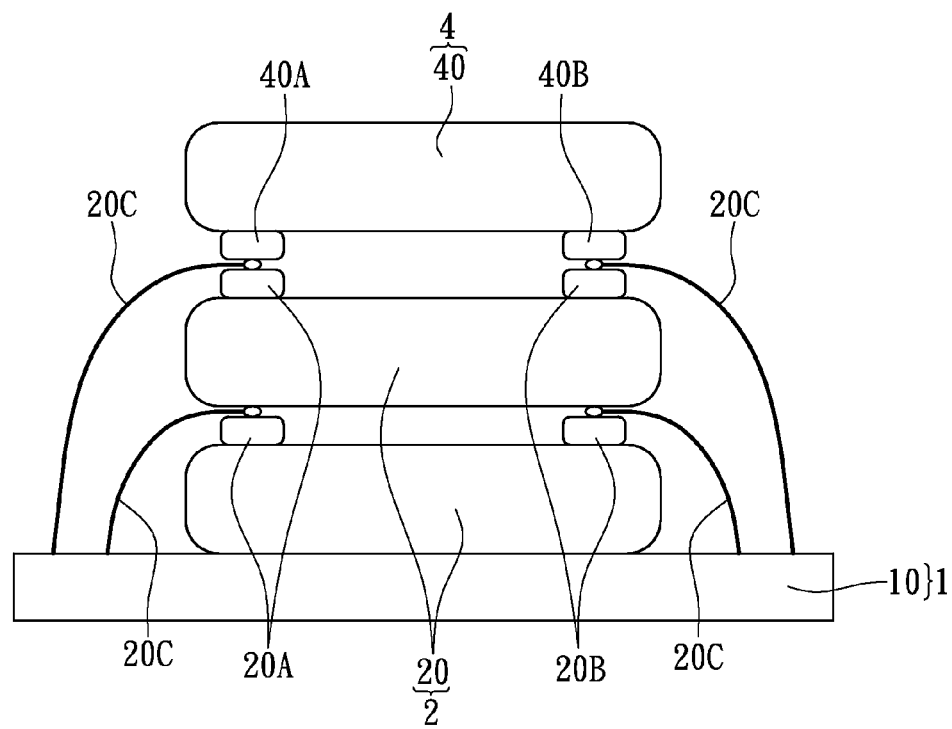
FIG. 10 shows a lateral, schematic view of the tenth embodiment of the instant disclosure.

Referring to FIG. 10, where the tenth embodiment provides a vertical stacked light emitting structure, comprising: a substrate unit 1, a first light emitting unit 2, and a second light emitting unit 4. In addition, the first light emitting unit 2 is a stacked type light emitting module, and the second light emitting unit 4 is a flip-chip type light emitting module. Comparing FIG. 10 with FIG. 6, the difference between the tenth embodiment and the sixth embodiment is that: in the tenth embodiment, the first light emitting unit 2 (the stacked type light emitting module) includes a plurality first LED bare chips 20 upwardly stacked on top of one another sequentially. Each first LED bare chip 20 has at least one first positive pad 20A and at least one first negative pad 20B disposed on the top surface thereof. The second light emitting unit 4 (the flip-chip type light emitting module) includes at least one second LED bare chip 40, and the second LED bare chip 40 has at least one second positive pad 40A and at least one second negative pad 40B disposed on the bottom surface thereof.

Eleventh Embodiment

Figure 11:
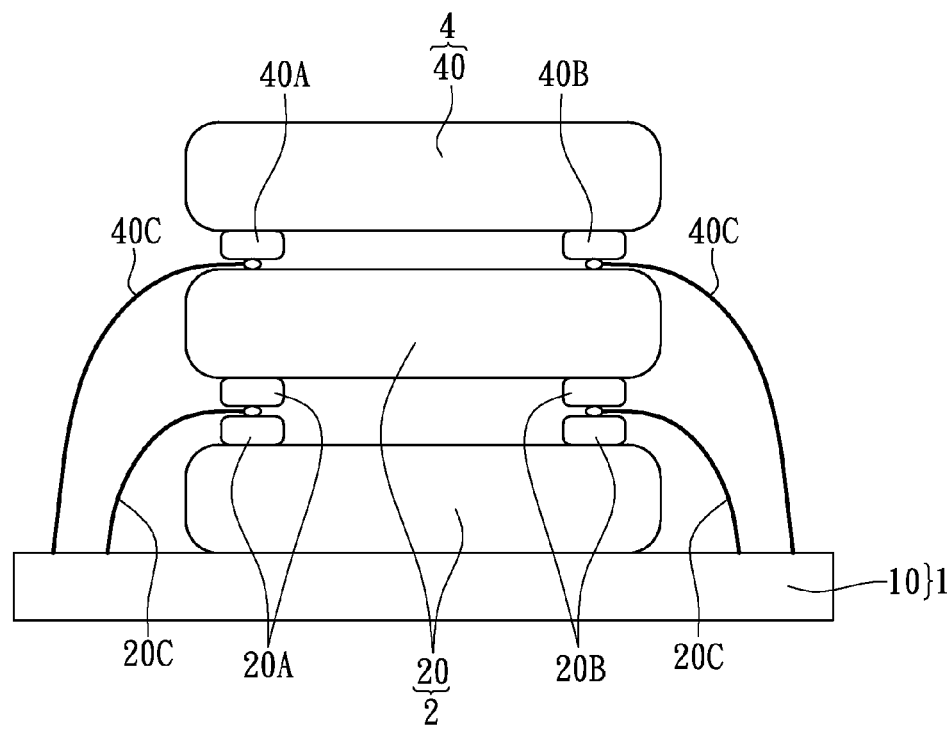
FIG. 11 shows a lateral, schematic view of the eleventh embodiment of the instant disclosure.

Referring to FIG. 11, where the eleventh embodiment provides a vertical stacked light emitting structure, comprising: a substrate unit 1, a first light emitting unit 2, and a second light emitting unit 4. In addition, the first light emitting unit 2 is a stacked type light emitting module, and the second light emitting unit 4 is a flip-chip type light emitting module. Comparing FIG. 11 with FIG. 6, the difference between the eleventh embodiment and the sixth embodiment is that: in the eleventh embodiment, the first light emitting unit 2 (the stacked type light emitting module) includes a plurality first LED bare chips 20 upwardly stacked on top of one another sequentially. Each first LED bare chip 20 has at least one first positive pad 20A and at least one first negative pad 20B selectively disposed on the top surface or the bottom surface thereof. The second light emitting unit 4 (the flip-chip type light emitting module) includes at least one second LED bare chip 40, and the second LED bare chip 40 has at least one second positive pad 40A and at least one second negative pad 40B disposed on the bottom surface thereof.

Twelfth Embodiment

Figure 12:
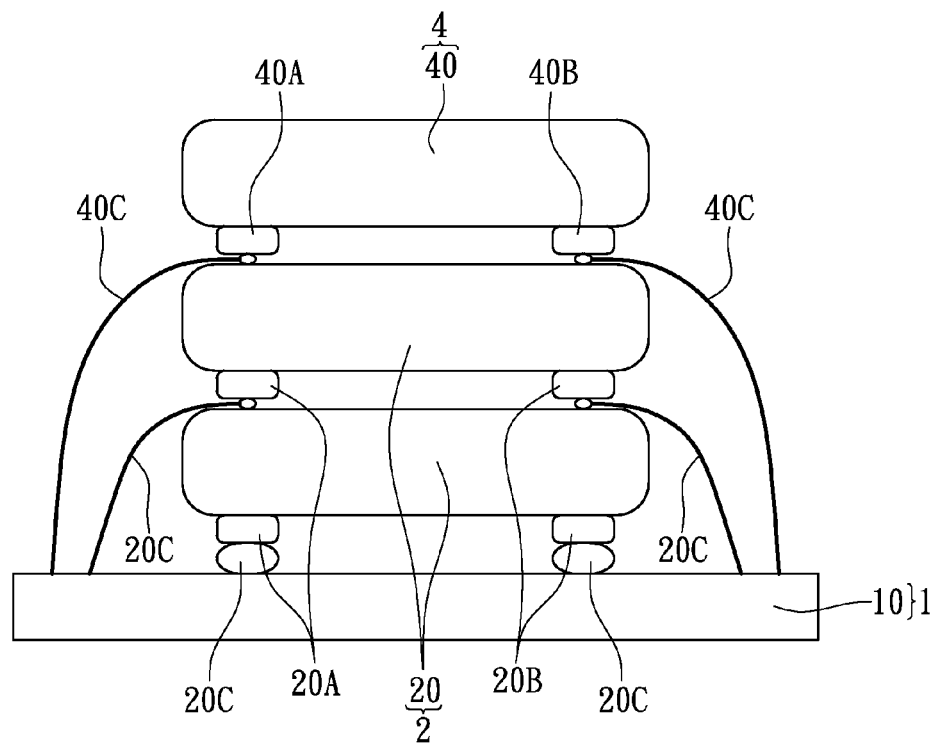
FIG. 12 shows a lateral, schematic view of the twelfth embodiment of the instant disclosure.

Referring to FIG. 12, where the twelfth embodiment provides a vertical stacked light emitting structure, comprising: a substrate unit 1, a first light emitting unit 2, and a second light emitting unit 4. In addition, the first light emitting unit 2 is a stacked type light emitting module, and the second light emitting unit 4 is a flip-chip type light emitting module. Comparing FIG. 12 with FIG. 8, the difference between the twelfth embodiment and the eighth embodiment is that: in the twelfth embodiment, the first light emitting unit 2 (the stacked type light emitting module) includes a plurality first LED bare chips 20 upwardly stacked on top of one another sequentially. Each first LED bare chip 20 has at least one first positive pad 20A and at least one first negative pad 20B disposed on the bottom surface thereof. The second light emitting unit 4 (the flip-chip type light emitting module) includes at least one second LED bare chip 40, and the second LED bare chip 40 has at least one second positive pad 40A and at least one second negative pad 40B disposed on the bottom surface thereof.

Thirteen Embodiment

Figure 13:
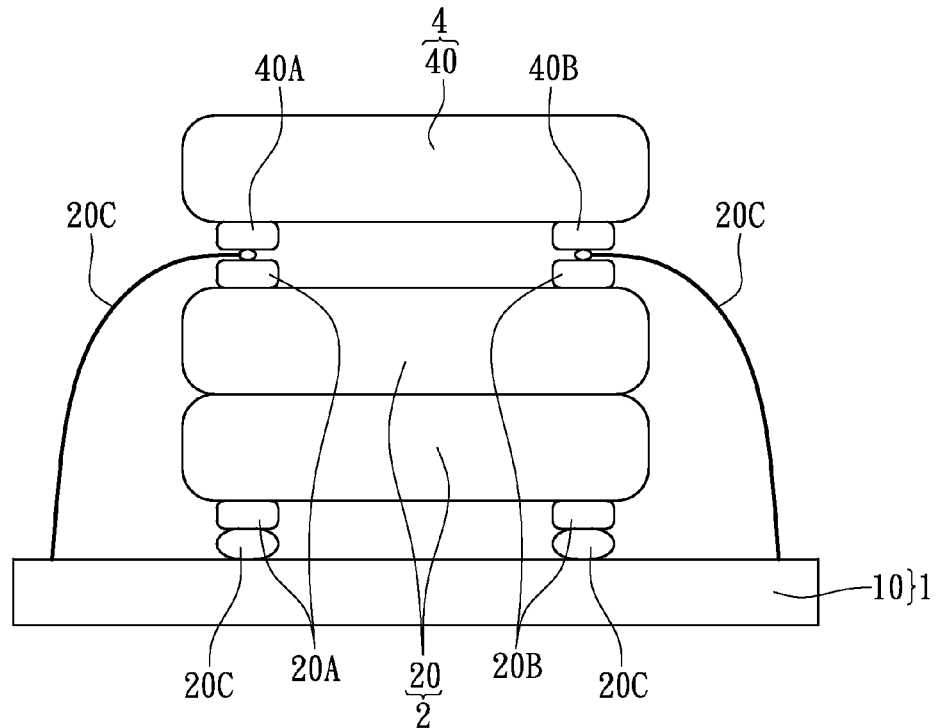
FIG. 13 shows a lateral, schematic view of the thirteen embodiment of the instant disclosure.

Referring to FIG. 12, where the thirteen embodiment provides a vertical stacked light emitting structure, comprising: a substrate unit 1, a first light emitting unit 2, and a second light emitting unit 4. In addition, the first light emitting unit 2 is a stacked type light emitting module, and the second light emitting unit 4 is a flip-chip type light emitting module. Comparing FIG. 13 with FIG. 8, the difference between the thirteen embodiment and the eighth embodiment is that: in the thirteen embodiment, the first light emitting unit 2 (the stacked type light emitting module) includes a plurality first LED bare chips 20 upwardly stacked on top of one another sequentially. Each first LED bare chip 20 has at least one first positive pad 20A and at least one first negative pad 20B selectively disposed on the top surface or the bottom surface thereof. The second light emitting unit 4 (the flip-chip type light emitting module) includes at least one second LED bare chip 40, and the second LED bare chip 40 has at least one second positive pad 40A and at least one second negative pad 40B disposed on the bottom surface thereof.

Fourteen Embodiment

Figure 14:
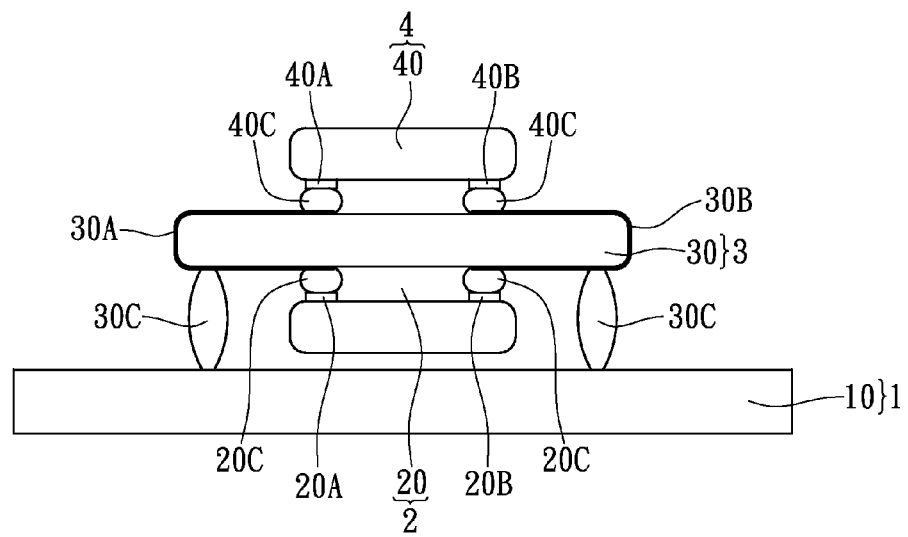
FIG. 14 shows a lateral, schematic view of the fourteen embodiment of the instant disclosure.

Referring to FIG. 14, where the fourteen embodiment provides a vertical stacked light emitting structure, comprising: a substrate unit 1, a first light emitting unit 2, a light guiding unit 3, and a second light emitting unit 4. In addition, the first light emitting unit 2 and the light guiding unit 3 are combined to form a stacked type light emitting module, and the second light emitting unit 4 is a flip-chip type light emitting module.

Furthermore, the substrate unit 1 includes at least one substrate body 10. The light guiding unit 3 includes at least one light guiding body 30 disposed on the substrate body 10, at least two conductive traces (30A, 30B) disposed on the light guiding body 30, and at least two conductive support members 30C disposed between the substrate body 10 and the light guiding body 30. Each of the conductive traces (30A, 30B) is electrically connected to the substrate body 10 through each corresponding conductive support member 30C. The first light emitting unit 2 includes at least one first LED bare chip 20 disposed on the bottom surface of the light guiding body 30 and electrically connected to the at least two conductive traces (30A, 30B). The bottom surface of the first LED bare chip 20 can selectively contact the top surface of the substrate body 10. The second light emitting unit 4 includes at least one second LED bare chip 40 disposed on the top surface of the light guiding body 30 and electrically connected to the at least two conductive traces (30A, 30B). Therefore, the first LED bare chip 20, the light guiding body 30, and the second LED bare chip 40 can be upwardly stacked on top of one another sequentially.

For example, the at least two conductive traces (30A, 30B) can be separated from each other by a predetermined distance and disposed on the outer surface of the light guiding body 30.

The first LED bare chip 20 can be electrically connected between the at least two conductive traces (30A, 30B) through at least two first conductive elements 20C (such as metal conductive wires or solder balls), and the second LED bare chip 40 can be electrically connected between the at least two conductive traces (30A, 30B) through at least two second conductive elements 40C (such as metal conductive wires or solder balls).

Fifteen Embodiment

Figure 15:
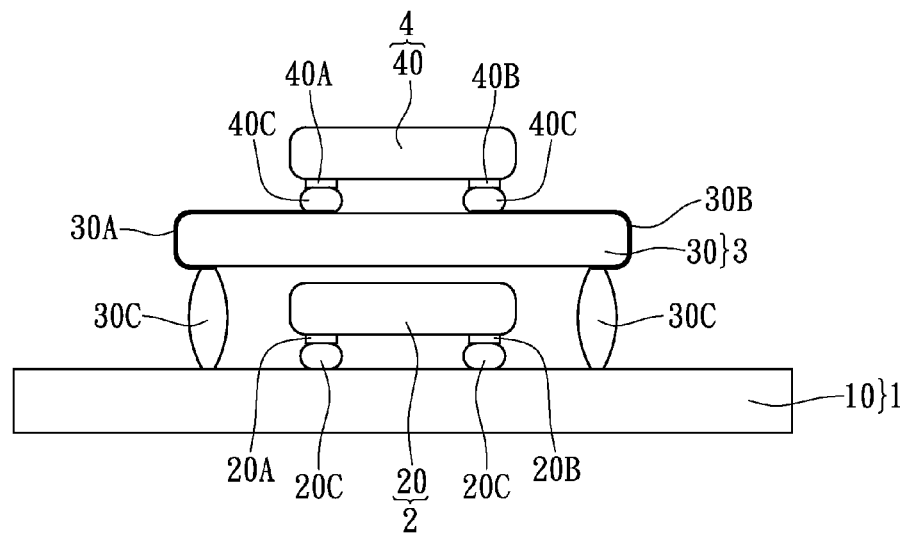
FIG. 15 shows a lateral, schematic view of the fifteen embodiment of the instant disclosure.

Referring to FIG. 15, where the fifteen embodiment provides a vertical stacked light emitting structure, comprising: a substrate unit 1, a first light emitting unit 2, a light guiding unit 3, and a second light emitting unit 4. Comparing FIG. 15 with FIG. 14, the difference between the fifteen embodiment and the fourteen embodiment is that: in the fifteen embodiment, the first LED bare chip 20 has at least one first positive pad 20A and at least one first negative pad 20B disposed on the bottom surface thereof, and at least two second conductive elements 20C (such as solder balls) are respectively electrically connected between the first positive pad 20A and the substrate body 10 and between the first negative pad 20B and the substrate body 10.

In conclusion, because the at least one first LED bare chip, the at least one light guiding body, and the at least one second LED bare chip are stacked on top of one another sequentially, or the at least one first LED bare chip and the at least one second LED bare chip are stacked on top of one another sequentially, the light-emitting efficiency of the instant disclosure can be increased.

The above-mentioned descriptions merely represent the preferred embodiments of the instant disclosure, without any intention or ability to limit the scope of the instant disclosure which is fully described only within the following claims. Various equivalent changes, alterations or modifications based on the claims of instant disclosure are all, consequently, viewed as being embraced by the scope of the instant disclosure.

What is claimed is:

1. A vertical stacked light emitting structure, comprising:
   a substrate body;
   a first light-emitting unit including a plurality of first LED bare chips stacked on top of one another and electrically connected to the substrate body, wherein the bottommost one of the first LED bare chips is disposed on the substrate body, the topmost one of the first LED bare chips is electrically connected to the substrate body through two first conductive wires, and each first LED bare chip has a first positive pad and a first negative pad;
   a light-guiding unit including at least one glass light-guiding body that is made of a glass material to form a prefabricated glass light-guiding plate disposed on the topmost first LED bare chip; and
   a second light-emitting unit including a plurality of second LED bare chips stacked on top of one another and electrically connected to the substrate body, wherein the bottommost one of the second LED bare chips is disposed on the top surface of the prefabricated glass light-guiding plate and electrically connected to the substrate body through two second conductive wires, and each second LED bare chip has a second positive pad and a second negative pad;
   wherein both the first positive pad and the first negative pad of the topmost first LED bare chip are disposed on the top surface of the topmost first LED bare chip and between the topmost first LED bare chip and the prefabricated glass light-guiding plate, and both the second positive pad and the second negative pad of the bottommost second LED bare chip are disposed on the bottom surface of the bottommost second LED bare chip and between the bottommost second LED bare chip and the prefabricated glass light-guiding plate.

2. The vertical stacked light emitting structure of claim 1, wherein the two first conductive wires are respectively electrically connected between the first positive pad of the topmost first LED bare chip and the substrate body and between the first negative pad of the topmost first LED bare chip and the substrate body, and the two second conductive wires are respectively electrically connected between the second positive pad of the bottommost second LED bare chip and the substrate body and between the second negative pad of the bottommost second LED bare chip and the substrate body.

3. The vertical stacked light emitting structure of claim 2, wherein each first conductive wire has a first soldering end, and the two first soldering ends of the first conductive wires are respectively disposed between the first positive pad of the topmost first LED bare chip and the prefabricated glass light-guiding plate and between the first negative pad of the topmost first LED bare chip and the prefabricated glass light-guiding plate, wherein each second conductive wire has a second soldering end, and the two second soldering ends of the second conductive wires are respectively disposed between the second positive pad of the bottommost second LED bare chip and the prefabricated glass light-guiding plate and between the second negative pad of the bottommost second LED bare chip and the prefabricated glass light-guiding plate.

4. A vertical stacked light emitting structure, comprising:
   a substrate body;
   a first light-emitting unit including a plurality of first LED bare chips stacked on top of one another and electrically connected to the substrate body, wherein the bottommost one of the first LED bare chips is disposed on the substrate body, the topmost one of the first LED bare chips is electrically connected to the substrate body through two first conductive wires, and each first LED bare chip has a first positive pad and a first negative pad;
   a light-guiding unit including a glass light-guiding body; and
   a second light-emitting unit including a plurality of second LED bare chips stacked on top of one another and electrically connected to the substrate body, wherein the bottommost one of the second LED bare chips is disposed on the top surface of the glass light-guiding body and electrically connected to the substrate body through two second conductive wires, and each second LED bare chip has a second positive pad and a second negative pad;
   wherein both the first positive pad and the first negative pad of the topmost first LED bare chip are disposed on the top surface of the topmost first LED bare chip and between the topmost first LED bare chip and the glass light-guiding body, and both the second positive pad and the second negative pad of the bottommost second LED bare chip are disposed on the bottom surface of the bottommost second LED bare chip and between the bottommost second LED bare chip and the glass light-guiding body.

5. The vertical stacked light emitting structure of claim 4, wherein the two first conductive wires are respectively electrically connected between the first positive pad of the topmost first LED bare chip and the substrate body and between the first negative pad of the topmost first LED bare chip and the substrate body, and the two second conductive wires are respectively electrically connected between the second positive pad of the bottommost second LED bare chip and the substrate body and between the second negative pad of the bottommost second LED bare chip and the substrate body.

6. The vertical stacked light emitting structure of claim 5, wherein each first conductive wire has a first soldering end, and the two first soldering ends of the first conductive wires are respectively disposed between the first positive pad of the topmost first LED bare chip and the glass light-guiding body and between the first negative pad of the topmost first LED bare chip and the glass light-guiding body, wherein each second conductive wire has a second soldering end, and the two second soldering ends of the second conductive wires are respectively disposed between the second positive pad of the bottommost second LED bare chip and the glass light-guiding body and between the second negative pad of the bottommost second LED bare chip and the glass light-guiding body.

7. The vertical stacked light emitting structure of claim 4, wherein the glass light-guiding body is made of a glass material to form a prefabricated glass light-guiding plate disposed between the at least one first LED bare chip and the at least one second LED bare chip.

8. A vertical stacked light emitting structure, comprising:
a substrate body;
a first light-emitting unit including at least one first LED bare chip disposed on the substrate body and electrically connected to the substrate body through two first conductive wires, and the at least one first LED bare chip has a first positive pad and a first negative pad disposed on the top surface thereof;
a light-guiding unit including a glass light-guiding body; and
a second light-emitting unit including at least one second LED bare chip disposed on the top surface of the glass light-guiding body and electrically connected to the substrate body through two second conductive wires, wherein the at least one second LED bare chip has a second positive pad and a second negative pad disposed on the bottom surface thereof;
wherein both the first positive pad and the first negative pad of the at least one first LED bare chip are disposed between the at least one first LED bare chip and the glass light-guiding body, and both the second positive pad and the second negative pad of the at least one second LED bare chip are disposed between the at least one second LED bare chip and the glass light-guiding body.

9. The vertical stacked light emitting structure of claim 8, wherein the two first conductive wires are respectively electrically connected between the first positive pad of the at least one first LED bare chip and the substrate body and between the first negative pad of the at least one first LED bare chip and the substrate body, and the two second conductive wires are respectively electrically connected between the second positive pad of the at least one second LED bare chip and the substrate body and between the second negative pad of the at least one second LED bare chip and the substrate body.

10. The vertical stacked light emitting structure of claim 9, wherein each first conductive wire has a first soldering end, and the two first soldering ends of the first conductive wires are respectively disposed between the first positive pad of the at least one first LED bare chip and the glass light-guiding body and between the first negative pad of the at least one first LED bare chip and the glass light-guiding body, wherein each second conductive wire has a second soldering end, and the two second soldering ends of the second conductive wires are respectively disposed between the second positive pad of the at least one second LED bare chip and the glass light-guiding body and between the second negative pad of the at least one second LED bare chip and the glass light-guiding body.

11. The vertical stacked light emitting structure of claim 8, wherein the glass light-guiding body is made of a glass material to form a prefabricated glass light-guiding plate disposed between the at least one first LED bare chip and the at least one second LED bare chip.

* * * * *